(12) United States Patent
Tang et al.

(10) Patent No.: US 11,354,928 B2
(45) Date of Patent: Jun. 7, 2022

(54) PHOTOELECTRIC DETECTION CIRCUIT AND METHOD, ARRAY SUBSTRATE, DISPLAY PANEL, AND FINGERPRINT IMAGE ACQUISITION METHOD

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Guoqiang Tang, Beijing (CN); Yang Wang, Beijing (CN); Yingsong Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 427 days.

(21) Appl. No.: 16/472,502

(22) PCT Filed: Feb. 28, 2019

(86) PCT No.: PCT/CN2019/076482
§ 371 (c)(1),
(2) Date: Jun. 21, 2019

(87) PCT Pub. No.: WO2019/233135
PCT Pub. Date: Dec. 12, 2019

(65) Prior Publication Data
US 2021/0357608 A1 Nov. 18, 2021

(30) Foreign Application Priority Data
Jun. 4, 2018 (CN) .......................... 201810563132.3

(51) Int. Cl.
*G06V 40/13* (2022.01)
*G09G 3/20* (2006.01)
(Continued)

(52) U.S. Cl.
CPC ........... *G06V 40/1318* (2022.01); *G09G 3/20* (2013.01); *G09G 3/3208* (2013.01);
(Continued)

(58) Field of Classification Search
CPC ...... G06K 9/0004; G09G 3/3208; G09G 3/20; G09G 2310/0275; G09G 2310/08;
(Continued)

(56) References Cited

U.S. PATENT DOCUMENTS

2006/0214893 A1* 9/2006 Tseng .................... G09G 3/3233
345/82
2015/0002414 A1* 1/2015 Tan ........................ G06F 3/0412
345/173

(Continued)

FOREIGN PATENT DOCUMENTS

| CN | 105044955 A | 11/2015 |
| CN | 106952612 A | 7/2017 |
| CN | 108646949 A | 10/2018 |

OTHER PUBLICATIONS

International Search Report and Written Opinion dated Apr. 3, 2019 from State Intellectual Property Office of the P.R. China.

*Primary Examiner* — Premal R Patel
(74) *Attorney, Agent, or Firm* — Dilworth & Barrese, LLP.; Michael J. Musella, Esq.

(57) ABSTRACT

A photoelectric detection circuit, a photoelectric detection method, an array substrate, a display panel, and a fingerprint image acquisition method are provided. The photoelectric detection circuit includes a pixel circuit and a phototransistor. The pixel circuit includes an infrared light-emitting
(Continued)

element and is configured to emit infrared light according to a scanning signal and a light-emitting data signal. The phototransistor is configured to detect the infrared light emitted by the pixel circuit and reflected by a detection object in response to a sampling control signal.

19 Claims, 7 Drawing Sheets

(51) Int. Cl.
*G09G 3/3208* (2016.01)
*H01L 27/32* (2006.01)

(52) U.S. Cl.
CPC . *H01L 27/3234* (2013.01); *G09G 2300/0426* (2013.01); *G09G 2310/0267* (2013.01); *G09G 2310/0272* (2013.01); *G09G 2310/0275* (2013.01); *G09G 2310/061* (2013.01); *G09G 2310/08* (2013.01)

(58) Field of Classification Search
CPC ... G09G 2310/0272; G09G 2310/0267; G09G 2310/061; G09G 2300/0426; G09G 2360/145; G09G 3/3233; H01L 27/3234; G06V 40/1318; G06F 3/0412; G06F 3/0416

See application file for complete search history.

(56) References Cited

U.S. PATENT DOCUMENTS

| | | | |
|---|---|---|---|
| 2016/0058339 A1* | 3/2016 | Eguchi | A61B 5/14546 |
| | | | 600/322 |
| 2016/0274719 A1* | 9/2016 | Yang | G06F 3/042 |
| 2016/0328090 A1* | 11/2016 | Klinghult | G09G 3/32 |
| 2017/0103248 A1* | 4/2017 | Yamamoto | H01L 31/125 |
| 2017/0163914 A1* | 6/2017 | Hara | H04N 5/378 |
| 2017/0177154 A1* | 6/2017 | Choo | G09G 3/3266 |
| 2017/0269782 A1 | 9/2017 | Wu | |
| 2018/0211088 A1* | 7/2018 | Cho | H01L 27/3272 |
| 2019/0278407 A1 | 9/2019 | Ma | |

\* cited by examiner

PHOTOELECTRIC DETECTION CIRCUIT AND METHOD, ARRAY SUBSTRATE, DISPLAY PANEL, AND FINGERPRINT IMAGE ACQUISITION METHOD

The present application claims priority of Chinese Patent Application No. 201810563132.3, filed on Jun. 4, 2018, the disclosure of which is incorporated herein by reference in its entirety as part of the present application.

TECHNICAL FIELD

Embodiments of the present disclosure relate to a photoelectric detection circuit, a photoelectric detection method, an array substrate, a display panel, and a fingerprint image acquisition method.

BACKGROUND

Nowadays, in the era of information, science and technicalization, biometric recognition technology is gradually emerging and is applied to more and more fields. The shortcomings of traditional password recognition technology are that it is easy to be lost, to be stolen, to be forgotten, etc. However, the biometric recognition technology can make up for the shortcomings of the traditional password recognition technology well, and gradually becomes the next generation of mainstream recognition technology. The biometric recognition technology comprises fingerprint, face, iris, vein, and other biometric characteristic recognition technologies, fingerprint recognition technology is one of these biometric characteristic recognition technologies and is the most mature and widely used.

Fingerprint recognition refers to a technology for performing identification by comparing the detailed feature points of different fingerprints. The fingerprint recognition technology involves many disciplines such as image processing, pattern recognition, computer vision, mathematical morphology, wavelet analysis, and so on. According to different working principles, the fingerprint recognition technology mainly includes a capacitive type, an optical type, and an ultrasonic type. Optical type of fingerprint recognition technology is an early applied fingerprint recognition technology, which mainly uses the principle of refraction and reflection of light. In a case of putting a finger on an optical lens, the angles of refraction of the light emitted from a built-in light source on the uneven line pattern of the finger surface and light and shade of the light reflected back are different, so that a fingerprint image can be obtained by detecting the light intensity, and then the fingerprint image is compared with the database to determine whether they are consistent.

SUMMARY

At least one embodiment of the present disclosure provides a photoelectric detection circuit, which comprises: a pixel circuit, comprising an infrared light-emitting element and configured to emit infrared light according to a scanning signal and a light-emitting data signal; and a phototransistor, configured to detect the infrared light emitted by the pixel circuit and reflected by a detection object in response to a sampling control signal.

For example, in the photoelectric detection circuit provided by an embodiment of the present disclosure, a gate electrode of the phototransistor is configured to be connected to a sampling control line to receive the sampling control signal, a first electrode of the phototransistor is configured to be connected to a first voltage terminal to receive a first voltage, and a second electrode of the phototransistor is configured to be connected to a detection signal line to apply an electrical signal generated by the phototransistor according to the infrared light to the detection signal line.

For example, in the photoelectric detection circuit provided by an embodiment of the present disclosure, the pixel circuit further comprises a drive circuit, a data writing circuit, and a compensation circuit; the drive circuit comprises a control terminal, a first terminal and a second terminal, and is configured to control a driving current for driving the infrared light-emitting element to emit light, and the first terminal of the drive circuit receives a first voltage of a first voltage terminal; the data writing circuit is connected to the control terminal of the drive circuit, and is configured to write the light-emitting data signal to the control terminal of the drive circuit in response to the scanning signal; the compensation circuit is connected to the control terminal of the drive circuit, the second terminal of the drive circuit and a second voltage terminal, and is configured to store the light-emitting data signal written by the data writing circuit, compensate the drive circuit, and adjust a voltage of the second terminal of the drive circuit in a coupling way; and a first terminal of the infrared light-emitting element is connected to the second terminal of the drive circuit, a second terminal of the infrared light-emitting element receives a second voltage of the second voltage terminal, and the infrared light-emitting element is configured to emit the infrared light according to the driving current.

For example, in the photoelectric detection circuit provided by an embodiment of the present disclosure, the pixel circuit further comprises a light-emitting control circuit and a reset circuit; the light-emitting control circuit is connected to the first terminal of the drive circuit, and is configured to apply the first voltage of the first voltage terminal to the first terminal of the drive circuit in response to a light-emitting control signal; and the reset circuit is connected to the second terminal of the drive circuit, and is configured to apply a reset voltage to the second terminal of the drive circuit in response to a reset signal.

For example, in the photoelectric detection circuit provided by an embodiment of the present disclosure, the drive circuit comprises a first transistor, a gate electrode of the first transistor serves as the control terminal of the drive circuit, a first electrode of the first transistor serves as the first terminal of the drive circuit, and a second electrode of the first transistor serves as the second terminal of the drive circuit; the data writing circuit comprises a second transistor, a gate electrode of the second transistor is configured to be connected to a scanning line to receive the scanning signal, a first electrode of the second transistor is configured to be connected to a data line to receive the light-emitting data signal, and a second electrode of the second transistor is configured to be connected to the gate electrode of the first transistor; and the compensation circuit comprises a first capacitor and a second capacitor, a first electrode of the first capacitor is configured to be connected to the gate electrode of the first transistor, a second electrode of the first capacitor is configured to be connected to the second electrode of the first transistor, a first electrode of the second capacitor is configured to be connected to the second electrode of the first transistor, and a second electrode of the second capacitor is configured to be connected to the second voltage terminal to receive the second voltage.

For example, in the photoelectric detection circuit provided by an embodiment of the present disclosure, the light-emitting control circuit comprises a third transistor, a gate electrode of the third transistor is configured to be connected to a light-emitting control line to receive the light-emitting control signal, a first electrode of the third transistor is configured to be connected to the first voltage terminal to receive the first voltage, and a second electrode of the third transistor is configured to be connected to the first terminal of the drive circuit; and the reset circuit comprises a fourth transistor, a gate electrode of the fourth transistor is configured to be connected to a reset line to receive the reset signal, a first electrode of the fourth transistor is configured to be connected to the second terminal of the drive circuit, and a second electrode of the fourth transistor is configured to be connected to the second voltage terminal to receive the reset voltage.

At least one embodiment of the present disclosure further provides an array substrate, which comprises a base substrate and the photoelectric detection circuit according to any one the embodiments of the present disclosure, the phototransistor is on the base substrate, and the infrared light-emitting element is on a side of the phototransistor away from the base substrate.

For example, in the array substrate provided by an embodiment of the present disclosure, along a direction away from the base substrate, the infrared light-emitting element sequentially comprises: a first electrode layer comprising a first sunk region formed by a portion having a reduced thickness; a first transparent electrode layer on a surface of a side of the first electrode layer away from the base substrate; an electroluminescent layer on a side of the first transparent electrode layer away from the base substrate and located at least in the first sunk region; and a second electrode layer on a surface of a side of the electroluminescent layer away from the base substrate.

For example, in the array substrate provided by an embodiment of the present disclosure, the first transparent electrode layer is provided with a second sunk region in the first sunk region, and the second sunk region is located in the first sunk region.

For example, in the array substrate provided by an embodiment of the present disclosure, the phototransistor and the infrared light-emitting element at least partially overlap in a direction perpendicular to the base substrate.

For example, in the array substrate provided by an embodiment of the present disclosure, the infrared light-emitting element further comprises a second transparent electrode layer, and the second transparent electrode layer is on a surface of a side of the first electrode layer close to the base substrate.

For example, the array substrate provided by an embodiment of the present disclosure further comprises a pixel circuit layer, the pixel circuit layer comprises a gate-electrode layer, and a gate electrode of the phototransistor and the gate-electrode layer are in a same layer.

For example, in the array substrate provided by an embodiment of the present disclosure, the pixel circuit layer further comprises a source-drain layer, the phototransistor further comprises an electrode layer, and the source-drain layer and the electrode layer are in a same layer.

At least one embodiment of the present disclosure further provides a display panel, which comprises the array substrate according to any one of the embodiments of the present disclosure.

For example, the display panel provided by an embodiment of the present disclosure further comprises a plurality of pixel unit groups, each of the plurality of pixel unit groups comprises a plurality of display pixels and at least one detection pixel, and the at least one detection pixel comprises the photoelectric detection circuit.

For example, the display panel provided by an embodiment of the present disclosure further comprises a gate drive circuit and a data drive circuit, the gate drive circuit is configured to provide the scanning signal to the plurality of display pixels and the at least one detection pixel of each of the plurality of pixel unit groups, and the data drive circuit is configured to provide a display data signal and the light-emitting data signal, to enable the plurality of display pixels to display and enable the infrared light-emitting element in the at least one detection pixel to emit the infrared light.

For example, the display panel provided by an embodiment of the present disclosure further comprises a detection signal acquisition circuit, and the detection signal acquisition circuit is configured to collect an electrical signal generated by the phototransistor according to the infrared light.

For example, in the display panel provided by an embodiment of the present disclosure, the detection signal acquisition circuit comprises an integrating circuit, and is configured to adopt the integrating circuit to collect, in a case where a sampling switch signal is turned on, a current signal generated by the phototransistor according to the infrared light, and to output a voltage signal corresponding to the current signal.

At least one embodiment of the present disclosure further provides a photoelectric detection method using the photoelectric detection circuit according to any one of the embodiments of the present disclosure, which comprises: providing the scanning signal and the light-emitting data signal to the pixel circuit to enable the infrared light-emitting element to emit the infrared light; and acquiring an electrical signal generated by the phototransistor in response to the sampling control signal and according to the infrared light emitted by the infrared light-emitting element.

At least one embodiment of the present disclosure further provides a fingerprint image acquisition method using the display panel according to any one of the embodiments of the present disclosure, which comprises: providing the scanning signal and the light-emitting data signal to the pixel circuit to enable the infrared light-emitting element to emit the infrared light; acquiring an electrical signal generated by the phototransistor in response to the sampling control signal and according to the infrared light emitted by the infrared light-emitting element and reflected by a fingerprint of a user; and obtaining an image of the fingerprint based on the electrical signal.

For example, the fingerprint image acquisition method provided by an embodiment of the present disclosure further comprises: reducing a frequency of the scanning signal provided to the pixel circuit in a case where the display pixels of the display panel do not display.

BRIEF DESCRIPTION OF THE DRAWINGS

In order to clearly illustrate the technical solutions of the embodiments of the disclosure, the drawings of the embodiments are briefly described in the following; it is obvious that the described drawings are only related to some embodiments of the disclosure and thus are not limitative to the disclosure.

DETAILED DESCRIPTION

Figure 1:
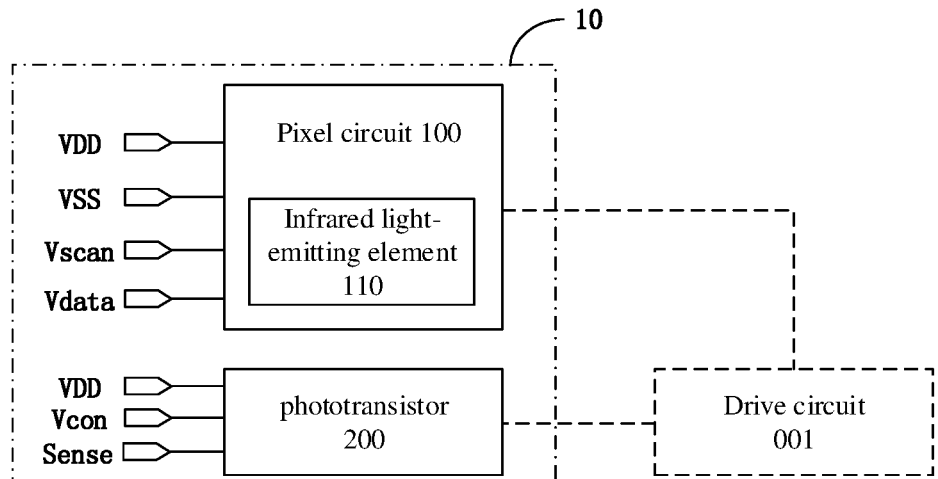
FIG. 1 is a schematic block diagram of a photoelectric detection circuit according to some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In recent years, with the development of the technological level, a near-infrared photodiode can be fabricated in a display panel and the display panel can emit near-infrared light, the fingerprint recognition is implemented by detecting the near-infrared light reflected by a finger, and furthermore the in-screen fingerprint recognition function is implemented. However, because the near-infrared photodiode has a PN or PIN structure, and needs to be fabricated by a doping process and using several different material, thereby increasing the process difficulty and easily causing additional defects. In addition, in order to reduce power consumption, the near-infrared photodiode should not operate for a long time, and therefore, it is necessary to provide a switching transistor in the circuit structure to control the near-infrared photodiode, resulting in a complicated circuit structure and high production cost.

At least one embodiment of the present disclosure provides a photoelectric detection circuit, a photoelectric detection method, an array substrate, a display panel, and a fingerprint image acquisition method. The photoelectric detection circuit uses a phototransistor to detect the infrared light emitted by the pixel circuit, the process difficulty is reduced, the circuit structure is simple, and the photosensitive responsivity is high, so as to be beneficial to implement the full-screen fingerprint recognition and the touch function.

Hereinafter, the embodiments of the present disclosure are described in detail with reference to the accompanying drawings. It should be noted that the same reference numerals are used in different drawings to refer to the same elements that have been described.

At least one embodiment of the present disclosure provides a photoelectric detection circuit, and the photoelectric detection circuit comprises a pixel circuit and a phototransistor. The pixel circuit comprises an infrared light-emitting element and is configured to emit infrared light according to a scanning signal and a light-emitting data signal. The phototransistor is configured to detect the infrared light emitted by the pixel circuit and reflected by a detection object in response to a sampling control signal.

FIG. 1 is a schematic block diagram of a photoelectric detection circuit according to some embodiments of the present disclosure. Referring to FIG. 1, a photoelectric detection circuit 10 comprises a pixel circuit 100 and a phototransistor 200.

The pixel circuit 100 comprises an infrared light-emitting element 110 and is configured to emit infrared light according to a scanning signal and a light-emitting data signal. For example, the pixel circuit 100 is connected to a scanning signal terminal Vscan, a light-emitting data signal terminal Vdata, a first voltage terminal VDD, and a second voltage terminal VSS, and is configured to write the light-emitting data signal supplied from the light-emitting data signal terminal Vdata to the inside of the pixel circuit 100 in response to the scanning signal supplied from the scanning signal terminal Vscan and store the light-emitting data signal, to drive the infrared light-emitting element 110 to emit the infrared light. For example, the first voltage terminal VDD is configured to maintain to input a DC high level signal, and the DC high level signal is referred to as a first voltage; and the second voltage terminal VSS is configured to maintain to input a DC low level signal, such as a grounded signal, and the DC low level signal is referred to as a second voltage. The following embodiments are the same as those described herein and are not be described again. For example, the first voltage terminal VDD and the second voltage terminal VSS are configured to supply the first voltage and the second voltage for the pixel circuit 100, thereby powering the pixel circuit 100 and providing a necessary current loop for the pixel circuit 100, so as to enable the infrared light-emitting element 110 to operate normally. For example, the pixel circuit 100 writes the light-emitting data signal to the inside of the pixel circuit 100 in response to the scanning signal and store the light-emitting data signal, and generates a corresponding driving current according to the light-emitting data signal, thereby enabling the infrared light-emitting element 110 to emit the infrared light. In this way, by providing different light-emitting data signals, the luminous intensity of the infrared light-emitting element 110 can be different, thereby satisfying the needs of various application scenarios and detection sensitivities. Moreover, this working mode is compatible with the driving mode and preparation process of the conventional display panel, thereby simplifying the control mode and improving the reliability of the device.

For example, the infrared light-emitting element 110 may be an infrared organic light-emitting diode (OLED). For example, a spectrum of the infrared light emitted by the infrared light-emitting element 110 is a near-infrared spectrum. Certainly, the embodiments of the present disclosure are not limited thereto, and the spectrum of the infrared light emitted by the infrared light-emitting element 110 may be one or more of a near-infrared spectrum, a mid-infrared spectrum, and a far-infrared spectrum.

For example, the pixel circuit 100 may also comprise any amount of transistors and any amount of capacitors, that is, the pixel circuit 100 may be a combination of any type of a pixel circuit used in the display panel and the infrared light-emitting element 110, for example, a combination of a circuit, such as 2T1C, 4T1C or 4T2C, and the infrared light-emitting element 110. The pixel circuit 100 may further have other functions, such as a voltage compensation function, a current compensation function, a hybrid compensation function, a reset function and so on, on the basis of a function of driving the infrared light-emitting element 110 to emit light.

The phototransistor 200 is configured to detect the infrared light emitted by the pixel circuit 100 and reflected by a detection object in response to a sampling control signal. For example, the phototransistor 200 is connected to a sampling control terminal Vcon, the first voltage terminal VDD and a detection signal terminal Sense, and is configured to generate an electrical signal according to the infrared light emitted by the infrared light-emitting element 110 in the pixel circuit 100 and reflected by the detection object under the function of the sampling control signal provided by the sampling control terminal Vcon, and to output the electrical signal to the detection signal terminal Sense. For example, the electrical signal is a current signal, and a current value of the current signal corresponds to the luminous intensity of the detected infrared light, for example, in one-to-one correspondence. For example, the detection object may be a finger (or a fingerprint) of the user, or may be a stylus or the like, and the embodiments of the present disclosure are not limited thereto. When performing the detection, the detection object is located on a display side of the display panel and is, for example, in contact with the display panel. For example, the phototransistor 200 has high photosensitivity in the near-infrared spectrum. Of course, the embodiments of the present disclosure are not limited thereto, and a working spectrum of the phototransistor 200 may be one or more of the near-infrared spectrum, the mid-infrared spectrum and the far-infrared spectrum, so long as the phototransistor 200 can detect the infrared light emitted by the infrared light-emitting element 110.

It should be noted that, in respective embodiments of the present disclosure, the phototransistor 200 is not limited to be connected to the first voltage terminal VDD, and may also be connected to a separately provided high voltage terminal or a separately provided low voltage terminal, as long as it can be ensured that the phototransistor 200 is supplied with a bias voltage to enable the phototransistor 200 to operate normally.

For example, the pixel circuit 100 and the infrared light-emitting element 110 therein can be manufactured by a process of a conventional display panel, and further, the phototransistor 200 can also be manufactured by a similar process, so that the photoelectric detection circuit 10 has low process difficulty, low production cost, and high production efficiency.

For example, the photoelectric detection circuit 10 can also be coupled, such as electrically connected, to a drive circuit 001 disposed outside the photoelectric detection circuit 10, to receive one or more of a scanning signal, a light-emitting data signal, a sampling control signal, and other signals provided by the drive circuit 001, or to transmit the electrical signal generated to the drive circuit 001 for recognition. For example, the drive circuit 001 may be a gate drive circuit, a data drive circuit or other driving chips disposed in the display panel, and be configured to provide one or more of the scanning signal, the light-emitting data signal, the sampling control signal, and other signals to the photoelectric detection circuit 10, or to receive the electrical signal generated from the photoelectric detection circuit 10, so as to generate a touch signal (for a touch function) or an image signal (for a fingerprint recognition function).

In a case where the finger of the user is placed at a detection position (for example, on a screen of the display panel), the infrared light emitted by the infrared light-emitting element 110 is reflected by the finger, so that the luminous intensity of the infrared light received by the phototransistor 200 is different from the luminous intensity of the infrared light received by the phototransistor 200 in a case where there is no finger at the detection position, thereby obtaining different electrical signals, thus implementing the touch detection or obtaining an fingerprint image, etc. The photoelectric detection circuit 10 uses the phototransistor 200 to detect the infrared light emitted by the infrared light-emitting element 110 in the pixel circuit 100, the process difficulty is low, the circuit structure is simple, and the photosensitive responsivity is high, so as to be beneficial to implement the full-screen fingerprint recognition and the touch function.

Figure 2:
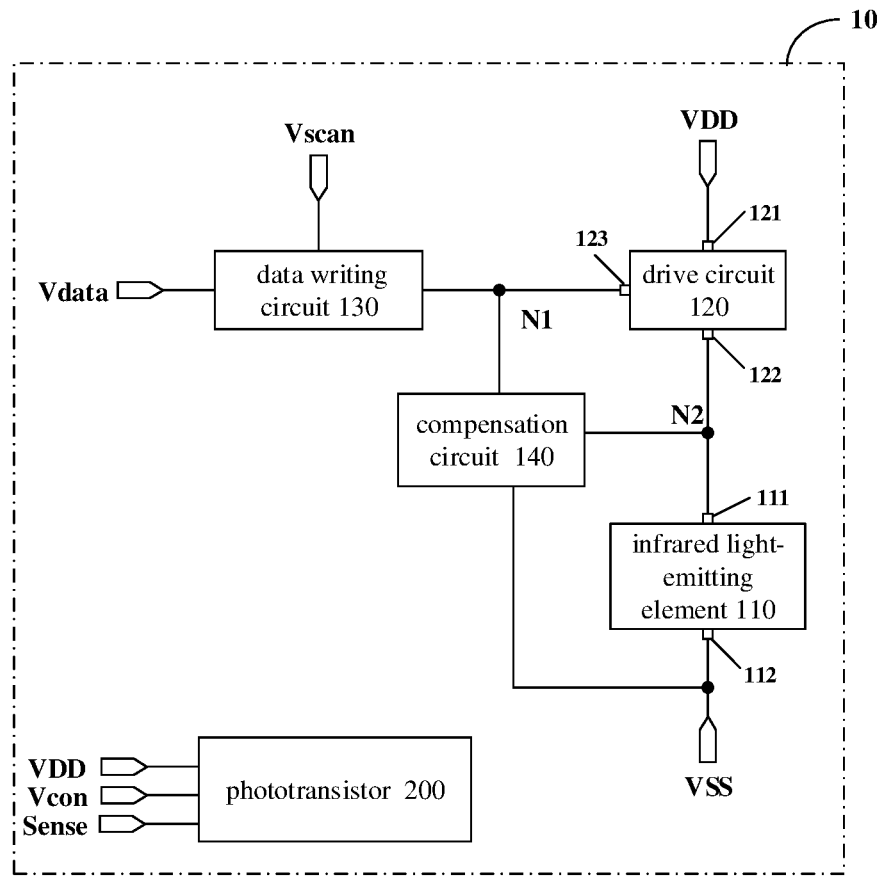
FIG. 2 is a schematic block diagram of another photoelectric detection circuit according to some embodiments of the present disclosure.

FIG. 2 is a schematic block diagram of another photoelectric detection circuit according to some embodiments of the present disclosure. Referring to FIG. 2, the pixel circuit 100 in the photoelectric detection circuit 10 may further comprise a drive circuit 120, a data writing circuit 130 and a compensation circuit 140, and other structures in the photoelectric detection circuit 10 are substantially the same as those of the photoelectric detection circuit 10 as illustrated in FIG. 1.

The drive circuit 120 comprises a first terminal 121, a second terminal 122 and a control terminal 123, and is configured to control a driving current for driving the infrared light-emitting element 110 to emit light, and the first terminal 121 of the drive circuit 120 receives the first voltage of the first voltage terminal VDD. For example, the control terminal 123 of the drive circuit 120 is connected to a first node N1, the first terminal 121 of the drive circuit 120 is connected to the first voltage terminal VDD, and the second terminal 122 of the drive circuit 120 is connected to a second node N2. For example, the drive circuit 120 can supply the driving current to the infrared light-emitting element 110 during operation to drive the infrared light-emitting element 110 to emit the infrared light, and to enable the infrared light-emitting element 110 to emit light according to desired brightness. For example, the infrared light-emitting element 110 may adopt an infrared OLED, and the embodiments of the present disclosure comprise, but are not limited to, this case.

The data writing circuit 130 is connected to the control terminal 123 of the drive circuit 120, and is configured to write the light-emitting data signal to the control terminal 123 of the drive circuit 120 in response to the scanning signal. For example, the data writing circuit 130 is connected to a data line (the light-emitting data signal terminal Vdata), the first node N1, and a scanning line (the scanning signal terminal Vscan). For example, the scanning signal from the scanning signal terminal Vscan is applied to the data writing circuit 130 to control whether the data writing circuit 130 is turned on or not. For example, in a data writing phase, the data writing circuit 130 may be turned on in response on the scanning signal, so that the light-emitting data signal provided by the light-emitting data signal terminal Vdata can be written to the control terminal 123 (the first node N1) of the drive circuit 120, and then the light-emitting data signal is stored in the compensation circuit 140, and the stored light-emitting data signal can be used to generate the driving current that drives the infrared light-emitting element 110 to emit light.

The compensation circuit 140 is connected to the control terminal 123 (the first node N1) of the drive circuit 120, the second terminal 122 (the second node N2) of the drive circuit 120, and the second voltage terminal VSS, and is configured to store the light-emitting data signal written by the data writing circuit 130 and compensate the drive circuit 120 and adjust a voltage of the second terminal 122 (the second node N2) of the drive circuit 120 in a coupling way. For example, in a case where the compensation circuit 140 comprises a capacitor, for example, in a compensation phase, the compensation circuit 140 may store related information of a threshold voltage of the drive circuit 120 in the capacitor accordingly. For another example, in the data writing phase, the compensation circuit 140 can store the light-emitting data signal written by the data writing circuit 130 in the capacitor, so that a stored voltage comprising the light-emitting data signal and the threshold voltage can be used to control the drive circuit 120 during, for example, a light-emitting phase, so as to enable an output of the drive circuit 120 to be compensated.

A first terminal 111 of the infrared light-emitting element 110 is connected to the second terminal 122 (the second node N2) of the drive circuit 120, a second terminal 112 of the infrared light-emitting element 110 receives the second voltage of the second voltage terminal VSS, and the infrared light-emitting element 110 is configured to emit the infrared light according to the above-mentioned driving current.

Figure 3:
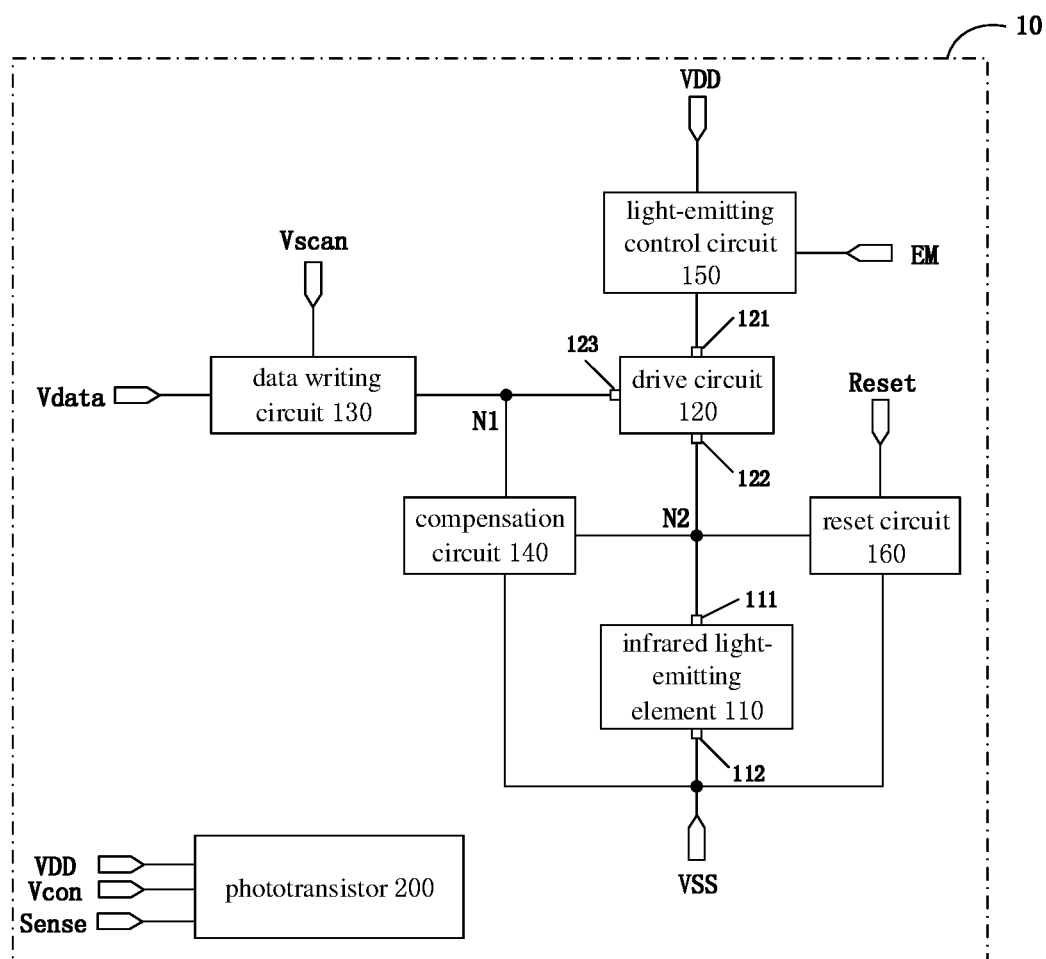
FIG. 3 is a schematic block diagram of still another photoelectric detection circuit according to some embodiments of the present disclosure.

FIG. 3 is a schematic block diagram of still another photoelectric detection circuit according to some embodiments of the present disclosure. Referring to FIG. 3, the pixel circuit 100 in the photoelectric detection circuit 10 may further comprise a light-emitting control circuit 150 and a reset circuit 160, and other structures in the photoelectric detection circuit 10 are substantially the same as those of the photoelectric detection circuit 10 as illustrated in FIG. 2.

The light-emitting control circuit 150 is connected to the first terminal 121 of the drive circuit 120, and is configured to apply the first voltage of the first voltage terminal VDD to the first terminal 121 of the drive circuit 120 in response to a light-emitting control signal. For example, the light-emitting control circuit 150 is connected to a light-emitting control line (a light-emitting control terminal EM), the first terminal 121 of the drive circuit 120, and the first voltage terminal VDD, respectively. For example, in the light-emitting phase, the light-emitting control circuit 150 is turned on in response to the light-emitting control signal provided by the light-emitting control terminal EM, so that the first voltage of the first voltage terminal VDD can be applied to the first terminal 121 of the drive circuit 120 through the light-emitting control circuit 150, thereby enabling the infrared light-emitting element 110 to emit light under the action of the driving current.

The reset circuit 160 is connected to the second terminal 122 (the second node N2) of the drive circuit 120, and is configured to apply a reset voltage to the second terminal 122 (the second node N2) of the drive circuit 120 in response to a reset signal. For example, the reset circuit 160 is connected to the second node N2, the second voltage terminal VSS, and a reset line (a reset signal terminal Reset), respectively. For example, in a reset phase, the reset circuit 160 may be turned on in response to the reset signal provided by the reset signal terminal Reset, thereby applying the reset voltage (here, a voltage for resetting is the second voltage) to the second node N2, so as to perform a reset operation on the second node N2 and the infrared light-emitting element 110, and eliminate the influence of a previous light-emitting phase. For example, the reset voltage may be provided by the second voltage terminal VSS, and may also be provided by a reset voltage terminal that is independent of the second voltage terminal VSS in other examples, thus accordingly, the reset circuit 160 is not connected to the second voltage terminal VSS but is connected to the reset voltage terminal, which is not limited in the embodiments of the present disclosure.

For example, in a case where the drive circuit 120 is implemented as a drive transistor, for example, a gate electrode of the drive transistor may serve as the control terminal 123 of the drive circuit 120 (be connected to the first node N1), a first electrode (such as a drain electrode) of the drive transistor may serve as the first terminal 121 of the drive circuit 120 (receiving the first voltage of the first voltage terminal VDD), and a second electrode (such as a source electrode) of the drive transistor may serve as the second terminal 122 of the drive circuit 120 (be connected to the second node N2).

It should be noted that, in the description of respective embodiments of the present disclosure, the symbol Vdata may represent both the light-emitting data signal terminal and the level of the light-emitting data signal. Similarity, the symbol Vscan can represent both the scanning signal terminal and the level of the scanning signal, the symbol Reset can represent both the reset signal terminal and the level of the reset signal, the symbol EM can represent both the light-emitting control terminal and the level of the light-emitting control signal, the symbol VDD can represent both the first voltage terminal and the first voltage, the symbol VSS can represent both the second voltage terminal and the second voltage, and the symbol Vcon can represent both the sampling control terminal and the level of the sampling control signal. The following embodiments are the same as those described herein and are not described again.

It should be noted that, the photoelectric detection circuit 10 provided by respective embodiments of the present disclosure may further comprise other circuit structures having an external compensation function. The external compensation function can be achieved by electrical compensation, optical compensation or a combination of the electrical compensation and the optical compensation. Of course, the embodiments of the present disclosure are not limited thereto, and the photoelectric detection circuit 10 may further comprise other circuit structures having an arbitrary function. Examples of circuits with other functions are not described in detail herein.

The photoelectric detection circuit 10 provided by the embodiments of the present disclosure uses the phototransistor 200 to detect the infrared light emitted by the infrared light-emitting element 110 in the pixel circuit 100, the process difficulty is low, the circuit structure is simple, and the photosensitive responsivity is high, so as to be beneficial to achieve the full-screen fingerprint recognition and the touch function.

Figure 4:
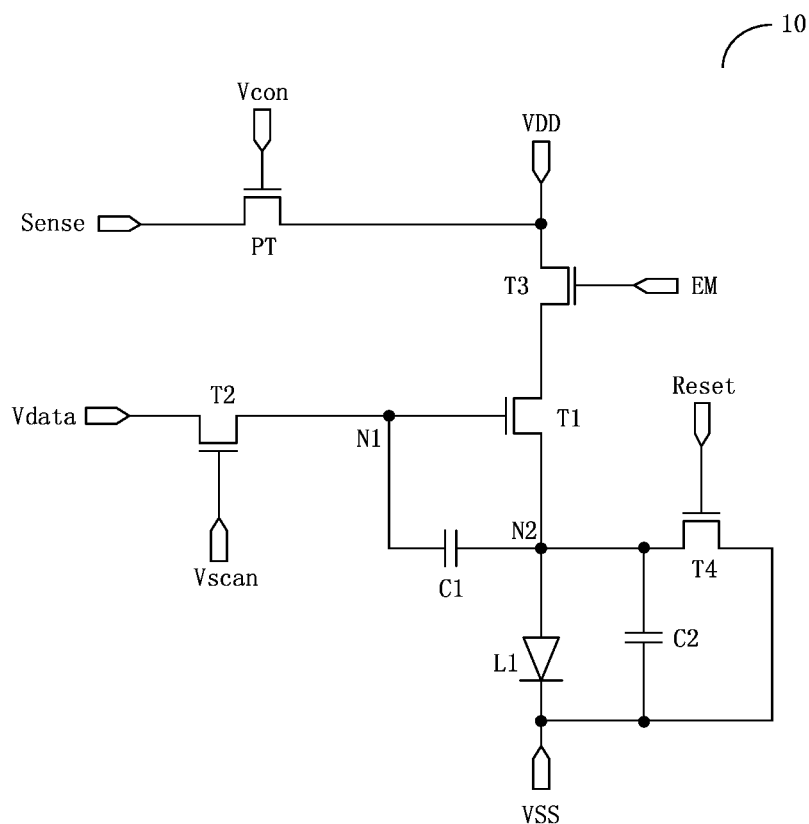
FIG. 4 is a circuit diagram of a specific implementation example of the photoelectric detection circuit as illustrated in FIG. 3.

FIG. 4 is a circuit diagram of a specific implementation example of the photoelectric detection circuit as illustrated in FIG. 3, and the photoelectric detection circuit 10 as illustrated in FIG. 3 can be obtained correspondingly. Referring to FIG. 4, the photoelectric detection circuit 10 comprises first to fourth transistors T1-T4, a phototransistor PT, an infrared light-emitting element L1, a first capacitor C1, and a second capacitor C2. For example, the first transistor T1 is used as a drive transistor, the second to fourth transistors T2-T4 are used as switching transistors. For example, the infrared light-emitting element L1 may be various types of infrared OLEDs, such as top emission, bottom emission, double-side emission, etc., and can emit near-infrared light, mid-infrared light, or far-infrared light, etc., which is not limited in the embodiments of the present disclosure.

For example, a gate electrode of the phototransistor PT is configured to be connected to the sampling control line (the sampling control terminal Vcon) to receive the sampling control signal, a first electrode of the phototransistor PT is configured to be connected to the first voltage terminal VDD to receive the first voltage, and a second electrode of the phototransistor PT is configured to be connected to the detection signal line (the detection signal terminal Sense) to apply an electrical signal generated by the phototransistor PT according to the infrared light to the detection signal line. In this example, the phototransistor PT shares the first voltage terminal VDD with the pixel circuit 100, so that wiring and power supply voltage settings can be simplified. Of course, the embodiments of the present disclosure are not limited thereto. In other examples, the first electrode of the phototransistor PT may also be connected to a voltage terminal that is separately provided, for example, in a case where a level of the bias voltage required by the phototransistor PT is different from the level of the first voltage, the required bias voltage is applied to the phototransistor PT by a separately provided voltage terminal, thereby enabling the photoelectric detection circuit 10 to be suitable for a plurality of phototransistors PT.

The drive circuit 120 may be implemented as the first transistor T1. A gate electrode of the first transistor T1 serves as the control terminal 123 of the drive circuit 120 and is connected to the first node N1, a first electrode of the first transistor T1 serves as the first terminal 121 of the drive circuit 120, and a second electrode of the first transistor T2 serves as the second terminal 122 of the drive circuit 120 and is connected to the second node N2. It should be noted that, the embodiments of the present disclosure are not limited thereto, and the drive circuit 120 may also be a circuit composed of other components to implement corresponding functions.

The data writing circuit 130 may be implemented as the second transistor T2. A gate electrode of the second transistor T2 is configured to be connected to the scanning line (the scanning signal terminal Vscan) to receive the scanning signal, a first electrode of the second transistor T2 is configured to be connected to the data line (the light-emitting data signal terminal Vdata) to receive the light-emitting data signal, and a second electrode of the second transistor T2 is configured to be connected to the gate electrode of the first transistor T1 (the first node N1). It should be noted that, the embodiments of the present disclosure are not limited thereto, and the data writing circuit 130 may also be a circuit composed of other components to implement corresponding functions.

The compensation circuit 140 may be implemented as the first capacitor C1 and the second capacitor C2. A first electrode of the first capacitor C1 is configured to be connected to the gate electrode of the first transistor T1 (the first node N1), and a second electrode of the first capacitor C1 is configured to be connected to the second electrode of the first transistor T1 (the second node N2). A first electrode of the second capacitor C2 is configured to be connected to the second electrode of the first transistor T1 (the second node N2), and a second electrode of the second capacitor C2 is configured to be connected to the second voltage terminal VSS to receive the second voltage. It should be noted that, the embodiments of the present disclosure are not limited thereto, and the compensation circuit 140 may also be a circuit composed of other components to implement corresponding functions.

The light-emitting control circuit 150 may be implemented as the third transistor T3. A gate electrode of the third transistor T3 is configured to be connected to the light-emitting control line (the light-emitting control terminal EM) to receive the light-emitting control signal, a first electrode of the third transistor T3 is configured to be connected to the first voltage terminal VDD to receive the first voltage, and a second electrode of the third transistor T3 is configured to be connected to the first terminal 121 of the drive circuit 120 (namely the first electrode of the first transistor T1). It should be noted that, the embodiments of the present disclosure are not limited thereto, and the light-emitting control circuit 150 may also be a circuit composed of other components to implement corresponding functions.

The reset circuit 160 may be implemented as the fourth transistor T4. A gate electrode of the fourth transistor T4 is configured to be connected to the reset line (the reset signal terminal Reset) to receive the reset signal, a first electrode of the fourth transistor T4 is configured to be connected to the second terminal 122 of the drive circuit 120 (the second node N2), and a second electrode of the fourth transistor T4 is configured to be connected to the second voltage terminal VSS to receive the reset voltage. Here, the second voltage supplied from the second voltage terminal VSS is used as the reset voltage. In other examples, a separately provided voltage may also be used as the reset voltage, and accordingly, the second electrode of the fourth transistor T4 is no longer connected to the second voltage terminal VSS, but is connected to a separately provided voltage terminal. It should be noted that, the embodiments of the present disclosure are not limited thereto, and the reset circuit 160 may also be a circuit composed of other components to implement corresponding functions.

The infrared light-emitting element L1, for example, may be an infrared OLED, and an organic light-emitting layer of the infrared OLED is formed by an infrared organic light-emitting material, which is not limited in the embodiments of the present disclosure. A first terminal 111 (here, an anode) of the infrared light-emitting element L1 is configured to be connected to the second node N2 and is configured to receive the driving current from the second terminal 122 of the drive circuit 120, and a second terminal 112 (here, a cathode) of the infrared light-emitting element L1 is connected to the second voltage terminal VSS to receive the second voltage. It should be noted that, the embodiments of the present disclosure are not limited thereto, and the infrared light-emitting element L1 may also be other components that can emit infrared light to implement corresponding functions.

It should be noted that, in respective embodiments of the present disclosure, the first node N1 and the second node N2 do not represent actual components, but rather represent junctions of associated electrical connections in the circuit diagram.

It should be noted that, transistors used in the embodiments of the present disclosure all may be thin film transistors, field effect transistors or other switching devices with the similar characteristics, and the embodiments of the present disclosure are described by taking the thin film transistors as an example. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode.

In addition, the transistors in the embodiments of the present disclosure are all described by taking N-type transistors as an example, and in this case, the first electrode of the transistor is the drain electrode, and the second electrode of the transistor is the source electrode. It should be noted that, the present disclosure includes but is not limited thereto. For example, one or more transistors in the photoelectric detection circuit 10 provided by the embodiments of the present disclosure may also adopt P-type transistors, and in this case, the first electrode of the transistor is the source electrode, and the second electrode of the transistor is the drain electrode, so long as the respective electrodes of the selected type transistor are connected correspondingly with reference to the connection manner of the respective electrodes of the corresponding transistor in the embodiments of the present disclosure, and the corresponding voltage terminal and signal terminal are provided with corresponding high level signal or low level signal. In a case where an N-type transistor is used, indium gallium zinc oxide (IGZO) can be adopted as the active layer of the thin film transistor, compared to low temperature poly silicon (LTPS) or amorphous silicon (for example, hydrogenation amorphous silicon) used as the active layer of the thin film transistor, the size of the transistor can be effectively reduced and the leakage current can be prevented.

Figure 5:
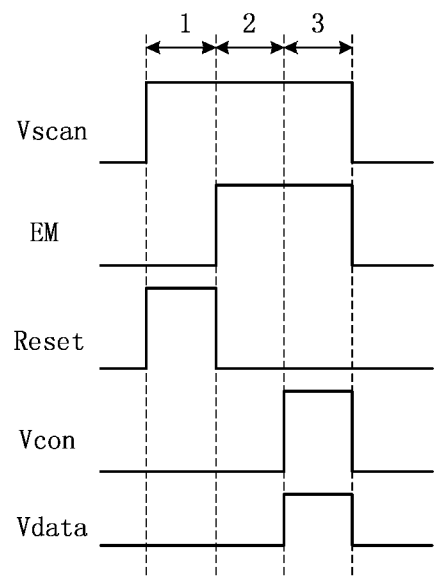
FIG. 5 is a timing diagram of signals of a photoelectric detection circuit according to some embodiments of the present disclosure.

FIG. 5 is a timing diagram of signals of a photoelectric detection circuit according to some embodiments of the present disclosure. The working principle of the photoelectric detection circuit 10 as illustrated in FIG. 4 is described below with reference to the signal timing diagram as illustrated in FIG. 5, and here, the description is provided by taking a case that the respective transistors are N-type transistors as an example, but the embodiments of the present disclosure are not limited thereto. As illustrated in FIG. 5, a detection process comprises three phases, which are a reset phase 1, a compensation phase 2, and a light-emitting phase 3, respectively, and timing waveforms of the respective signals in each phase are illustrated in FIG. 5.

In the reset phase 1, the scanning signal terminal Vscan and the reset signal terminal Reset provide high level signals, and the second transistor T2 and the fourth transistor T4 are turned on. At this time, the light-emitting data signal terminal Vdata provides a reference voltage Vref, and for example, the reference voltage Vref is higher than the second voltage provided by the second voltage terminal VSS. The reference voltage Vref is written into the first node N1 through the second transistor T2. The second voltage is written into the second node N2 through the fourth transistor T4. At this time, the first transistor T1 is turned on.

In the compensation phase 2, the scanning signal terminal Vscan and the light-emitting control terminal EM provide high level signals, and the reset signal terminal Reset provides a low level signal. The third transistor T3 is turned on, the second transistor T2 and the first transistor T1 remain to be turned on, and the fourth transistor T4 is turned off. The first voltage terminal VDD charges the second node N2 through the third transistor T3 and the first transistor T1, to raise the potential of the second node N2. It is easy to understand that, in this phase, the potential of the first node N1 is maintained as the reference voltage Vref, and according to the characteristics of the first transistor T1 itself, when the potential of the second node N2 is raised to Vref-Vth, the first transistor T1 is turned off, and the charging process ends. It should be noted that, Vth represents a threshold voltage of the first transistor T1. Because in this embodiment, a case that the first transistor T1 is an N-type transistor is taken as an example for describing, the threshold voltage Vth here is a positive value.

After the compensation phase 2, the potential of the first node N1 is maintained as the reference voltage Vref, and the potential of the second node N2 is Vref-Vth, that is, voltage information with the threshold voltage Vth is stored in the first capacitor C1, and is used to compensate the threshold voltage Vth of the first transistor T1 itself during the subsequent light-emitting phase. For example, according to the threshold voltage Vth of the first transistor T1, a suitable reference voltage Vref is selected, so that the conduction time of the first transistor T1 in the compensation phase 2 is relatively short and the current flowing through the first transistor T1 is relatively small, thereby avoiding causing the infrared light-emitting element L1 to emit light.

In the light-emitting phase 3, the scanning signal terminal Vscan, the light-emitting control terminal EM, the light-emitting data signal terminal Vdata, and the sampling control terminal Vcon provide high level signals, the second transistor T2 and the third transistor T3 remain to be turned on, and the first transistor T1 and the phototransistor PT are also turned on. For example, in this case, the level of the light-emitting data signal Vdata supplied from the light-emitting data signal terminal Vdata is higher than that of the reference voltage Vref. The light-emitting data signal Vdata charges the first node N1 through the second transistor T2, so that the potential of the first node N1 is raised from the reference voltage Vref to Vdata. Due to the characteristics of the capacitor itself, a change in the potential of one terminal (i.e., the first node N1) of the first capacitor C1 may cause a change in the potential of the other terminal (i.e., the second node N2) of the first capacitor C1 due to the bootstrap effect, and meanwhile, according to connection in series of the first capacitor C1 and the second capacitor C2, the potential of one terminal (namely, the terminal connected to the second voltage terminal VSS) of the second capacitor C2 remains unchanged, and according to the principle of charge conservation, the potential of the second node N2 can be changed to Vref−Vth+(Vdata−Vref)C1/(C1+C2). It should be noted that, in respective embodiments of the present disclosure, C1 may represent both the first capacitor and the capacitance value of the first capacitor; and C2 may represent both the second capacitor and the capacitance value of the second capacitor. In this case, the voltage information with the light-emitting data signal Vdata is stored in the first capacitor C1.

The first transistor T1 is turned on under the action of the high level of the first node N1, and the infrared light-emitting element L1 emits the infrared light under the action of the driving current flowing through the first transistor T1.

For example, a value of the driving current $I_{OLED}$ flowing through the infrared light-emitting element L1 can be obtained according to following formula:

$$I_{OLED}=½*K*(Vgs-Vth)^2.$$

Following values are substituted into the above formula:

$$Vg=V_{N1}=Vdata,$$

$$Vs=V_{N2}=Vref-Vth+(Vdata-Vref)C1/(C1+C2).$$

Thus, it can be obtained:

$$I_{OLED}=½*K*((Vdata-Vref)C2/(C1+C2))^2.$$

In the above formulas, Vth represents the threshold voltage of the first transistor T1, Vgs represents a voltage between the gate electrode and the second electrode (such as, the source electrode) of the first transistor T1, $V_{N1}$ represents the potential of the first node N1, $V_{N2}$ represents the potential of the second node N2, and K is a constant value.

It can be seen from the above formulas that, on the one hand, the driving current $I_{OLED}$ flowing through the infrared light-emitting element L1 is no longer related to the threshold voltage Vth of the first transistor T1, thereby implementing the compensation of the photoelectric detection circuit 10, solving the problem of the threshold voltage drift of the drive transistor (the first transistor T1 in the embodiments of the present disclosure) due to the manufacturing process and long-time operation, and eliminating the influence of the threshold voltage drift of the drive transistor on the driving current $I_{OLED}$, so that the problem of uneven illumination of the infrared light-emitting element L1 can be avoided, fingerprint recognition sensitivities at different detection positions are kept consistent, and the fingerprint recognition effect is improved. On the other hand, the driving current $I_{OLED}$ flowing through the infrared light-emitting element L1 is no longer related to the first voltage VDD, thereby solving the problem of the difference in the intensity of the infrared light caused by the voltage drop between the first voltage VDD at the far end and the first voltage VDD at the near end of the integrated circuit, so that the fingerprint recognition effect of the display panel adopting the photoelectric detection circuit 10 can be improved.

In the light-emitting phase 3, the phototransistor PT is turned on under the action of the high level provided by the sampling control terminal Vcon, generates an electrical signal according to the received infrared light, and applies the electrical signal to the detection signal line (the detection signal terminal Sense). For example, the electrical signal is a current signal. For example, in a case where a finger of a user is not placed at a detection position (for example, on the screen of the display panel), the phototransistor PT generates a background current $I_0$ according to the infrared light emitted by the infrared light-emitting element L1. In a case where the finger of the user is placed at the detection position, the infrared light emitted by the infrared light-emitting element L1 is reflected by the finger, in this case, the luminous intensity of the infrared light that is incident on the phototransistor PT is different from the luminous intensity of the infrared light that is incident on the phototransistor PT when the finger is not placed at the detection position, and the phototransistor PT can generate a detection current $I_1$ according to the luminous intensity of the infrared light at this time. For example, $I_0$ and $I_1$ can be collected by a separately provided detection signal acquisition circuit which is connected to the detection signal line, and calculated and processed by a separately provided processing circuit to obtain an image of the fingerprint.

For example, full-screen fingerprint recognition can be implemented by the photoelectric detection circuit 10. Further, a touch function can also be implemented in the above way. For example, in other examples, in a case where only the touch function needs to be implemented and the fingerprint recognition function does not need to be implemented, the distribution density of the photoelectric detection circuits 10 in the display panel can be reduced, thereby reducing the power consumption and the production cost while implementing the touch function.

In a case where the luminous intensity of the light reflected by the finger is small, for example, is less than 10% of the luminous intensity of the emitted light, the above-described fingerprint recognition method requires a high responsivity of the phototransistor PT. For example, the value of the background current $I_0$ of the phototransistor PT can be adjusted by adjusting the gate voltage (that is, the voltage of the sampling control signal) of the phototransistor PT, to obtain an optimized responsivity.

Moreover, due to the structural characteristics of the phototransistor PT itself, the exposed channel region of the phototransistor PT does not need to be doped with a P-type or an N-type semiconductor material, but only need one type of semiconductor material, which can be achieved by, for example, a magnetron sputtering process, thereby reducing the process difficulty. The phototransistor PT itself has a switching function and does not require to be provided with a switching transistor specially, so that the circuit structure can be simplified.

At least one embodiment of the present disclosure further provides a display panel, which comprises the array substrate according to any one of the embodiments of the present disclosure. The display panel has low process difficulty, simple circuit structure, and high photosensitive responsivity, which is beneficial to implement the full-screen fingerprint recognition and the touch function. The array substrate provided by the embodiments of the present disclosure is described in detail later.

Figure 6:
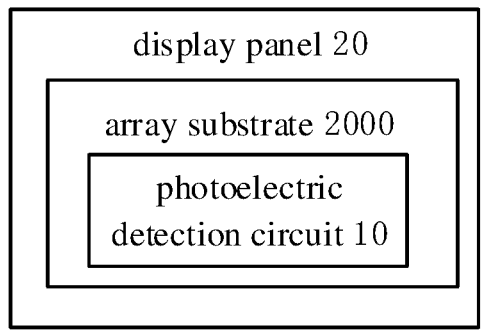
FIG. 6 is a schematic block diagram of a display panel according to some embodiments of the present disclosure.

FIG. 6 is a schematic block diagram of a display panel according to some embodiments of the present disclosure. Referring to FIG. 6, a display panel 20 comprises an array substrate 2000, and the array substrate 2000 is the array substrate according to any one of the embodiments of the present disclosure. The array substrate 2000 comprises a photoelectric detection circuit 10, and the photoelectric detection circuit 10 is the photoelectric detection circuit according to any one of the embodiments of the present disclosure. For example, the display panel 20 may be any product or component having a display function such as a liquid crystal panel, an OLED panel, an electronic paper display panel, or the like, which is not limited in the embodiments of the present disclosure. For the technical effects of the display panel 20, reference may be made to the corresponding description of the photoelectric detection circuit 10 in the above embodiments and the corresponding description of the array substrate hereinafter, and details are not described herein again.

Figure 7A:
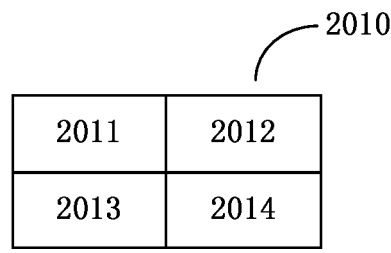
FIGS. 7A-7C are schematic diagrams illustrating arrangement modes of pixel unit groups of a display panel according to some embodiments of the present disclosure.
Figure 7B:
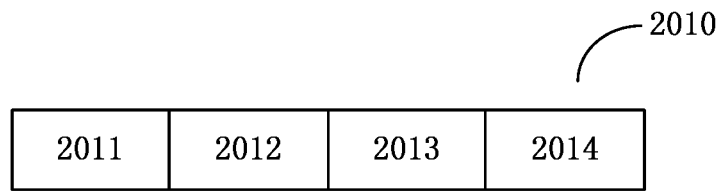
Figure 7C:
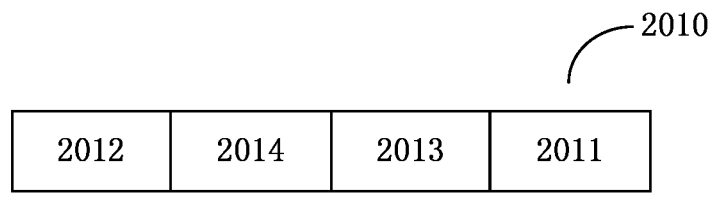

For example, the display panel 20 further comprises a plurality of pixel unit groups 2010. As illustrated in FIG. 7A to FIG. 7C, the plurality of pixel unit groups 2010 can have various arrangement modes. For example, each of the plurality of pixel unit groups 2010 comprises a plurality of display pixels (for example, a first display pixel 2011, a second display pixel 2012, and a third display pixel 2013) and at least one detection pixel 2014. The detection pixel 2014 comprises the photoelectric detection circuit 10. The first display pixel 2011, the second display pixel 2012, and the third display pixel 2013 are configured to display according to scanning signals and display data signals, and the detection pixel 2014 is configured to perform a fingerprint detection or a touch detection based on a scanning signal and a light-emitting data signal. For example, the first display pixel 2011 may be a red display pixel, the second display pixel 2012 may be a green display pixel, and the third display pixel 2013 may be a blue display pixel. Of course, the embodiments of the present disclosure are not limited thereto, each display pixel can be a display pixel of any color. It should be noted that, in the respective embodiments of the present disclosure, each pixel unit group 2010 may also comprise a plurality of first display pixels 2011, a plurality of second display pixels 2012, and a plurality of third display pixels 2013, and is not limited to the amount and arrangement modes as illustrated in FIGS. 7A to 7C.

For example, in an example, as illustrated in FIG. 7A, the first display pixel 2011, the second display pixel 2012, the third display pixel 2013, and the detection pixel 2014 are arranged in two rows and two columns. For example, in another example, as illustrated in FIG. 7B, the first display pixel 2011, the second display pixel 2012, the third display pixel 2013, and the detection pixel 2014 are sequentially arranged in a row. For example, in still another example, as illustrated in FIG. 7C, the second display pixel 2012, the detection pixel 2014, the third display pixel 2013, and the first display pixel 2011 are sequentially arranged in a row. It should be noted that, in the respective embodiments of the present disclosure, the arrangement mode of the plurality of display pixels and the detection pixel is not limited, and may be flexibly designed according to requirements.

It should be noted that, the pixel unit group 2010 can serve as a minimum repeat unit, and the pixel unit groups 2010 may be arranged in an array in the display panel 20, that is, each pixel unit group in the display panel 20 comprises the detection pixel 2014. Certainly, the embodiments of the present disclosure are not limited thereto, the display panel 20 may further comprise pixel unit groups which do not comprise the detection pixel 2014, and these pixel unit groups are used only for display. The pixel unit groups 2010 and these pixel unit groups used only for display can be arranged in a cross manner or in any manners.

Figure 8:
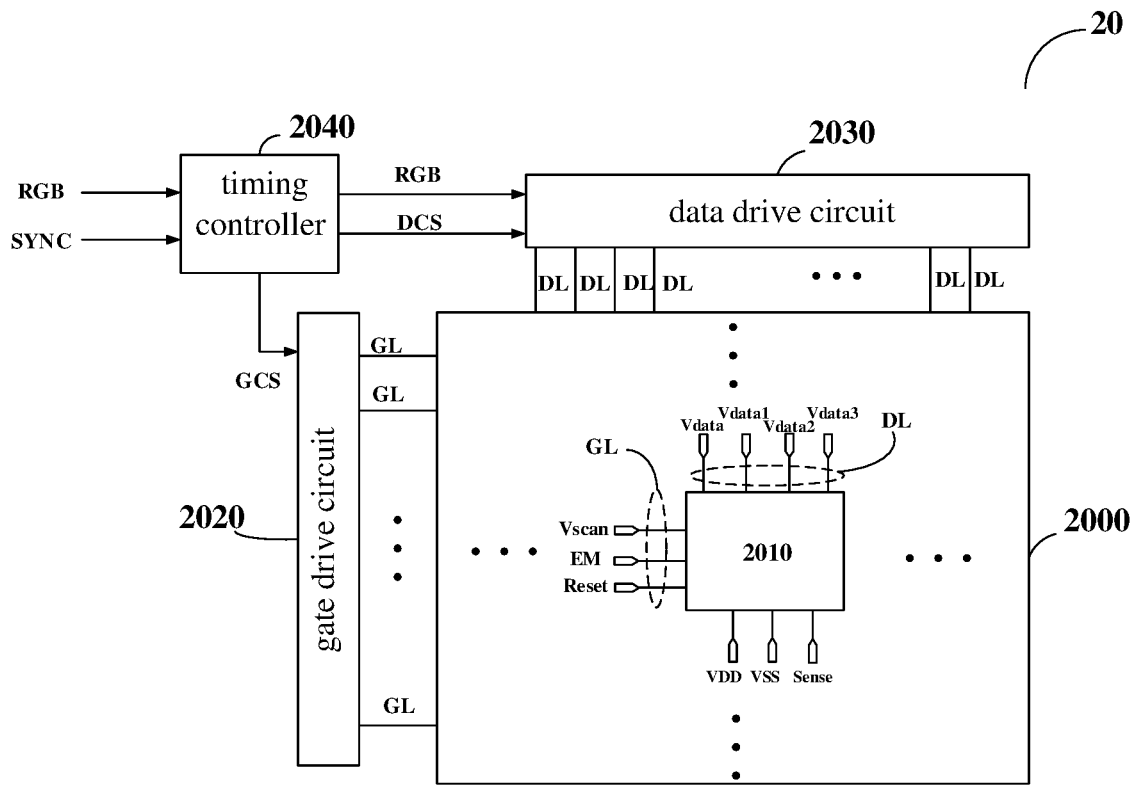
FIG. 8 is a schematic block diagram of another display panel according to some embodiments of the present disclosure.

FIG. 8 is a schematic block diagram of another display panel according to some embodiments of the present disclosure. Referring to FIG. 8, a display panel 20 comprises an array substrate 2000, a gate drive circuit 2020, a data drive circuit 2030, and a timing controller 2040. The array substrate 2000 comprises a plurality of pixel unit groups 2010 defined by a plurality of scanning lines GL and a plurality of data lines DL that intersect. The gate drive circuit 2020 is configured to drive the plurality of scanning lines GL. The data drive circuit 2030 is configured to drive the plurality of data lines DL. The timing controller 2040 is configured to process image data RGB input from the outside of the display panel 20, provide processed image data RGB to the data drive circuit 2030, and respectively output scanning control signals GCS and data control signals DCS to the gate drive circuit 2020 and the data drive circuit 2030, so as to control the gate drive circuit 2020 and the data drive circuit 2030.

For example, the array substrate 2000 comprises a plurality of pixel unit groups 2010, and a detection pixel in the pixel unit group 2010 comprises the photoelectric detection circuit 10 described in any one of the above embodiments. The array substrate 2000 further comprises the plurality of scanning lines GL and the plurality of data lines DL. For example, the display pixels and the detection pixel in the pixel unit group 2010 are disposed in intersection regions of the scanning lines GL and the data lines DL. For example, in an example, the pixel unit groups 2010 adopt the arrangement mode as illustrated in FIG. 7B, and each pixel unit group 2010 is connected to three scanning lines GL (providing a scanning signal, a light-emitting control signal, and a reset signal, respectively), four data lines DL (providing display data signals for the three display pixels respectively, and providing a light-emitting data signal for the detection pixel), a first voltage line for supplying a first voltage, a second voltage line for supplying a second voltage, and a detection signal line. For example, the first voltage line or the second voltage line may be replaced with a corresponding plate common electrode (such as a common anode or a common cathode). It should be noted that only a part of the pixel unit groups 2010, a part of the scanning lines GL and a part of the data lines DL are illustrated in FIG. 8.

For example, the gate drive circuit 2020 is configured to provide scanning signals to the display pixels and the detection pixel of each pixel unit group 2010. The gate drive circuit 2020 can also be configured to provide light-emitting control signals, reset signals, and the like. For example, the gate drive circuit 2020 may be disposed outside the array substrate 2000 or may be disposed on the array substrate 2000 to constitute a gate-driver on array (GOA).

For example, the data drive circuit 2030 converts the digital image data RGB input from the timing controller 2040 into the display data signals according to the plurality of data control signals DCS derived from the timing controller 2040 by using reference gamma voltages. For example, the data drive circuit 2030 is configured to provide the display data signals and the light-emitting data signal, to enable the display pixels to display and enable an infrared light-emitting element in the detection pixel to emit infrared light. The data drive circuit 2030 provides the converted display data signals and the light-emitting data signal for the fingerprint recognition or the touch detection to the plurality of data lines DL. For example, the data drive circuit 2030 may be disposed on the array substrate 2000 or outside the array substrate 2000.

For example, the timing controller 2040 processes the image data RGB input from the outside to match the size and resolution of the display panel 20, and then supplies the processed image data to the data drive circuit 2030. The timing controller 2040 generates the plurality of scanning control signals GCS and the plurality of data control signals DCS by using synchronization signals (for example, a dot clock DCLK, a data enable signal DE, a horizontal synchronization signal Hsync, and a vertical synchronization signal Vsync) input from the outside of the display panel 20. The timing controller 2040 respectively provides the generated scanning control signals GCS and the generated data control signals DCS to the gate drive circuit 2020 and the data drive circuit 2030 for controlling the gate drive circuit 2020 and the data drive circuit 2030.

For example, the gate drive circuit 2020 and the data drive circuit 2030 may be implemented as a semiconductor chip. The display panel 20 may also include other components, such as signal decoding circuits, voltage conversion circuits, etc., and these components may be, for example, conventional components, and may not be described in detail herein.

Figure 9:
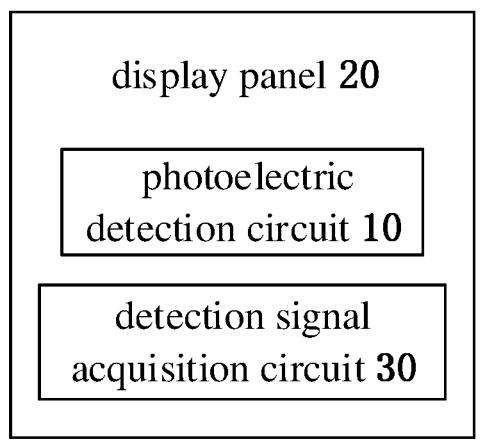
FIG. 9 is a schematic block diagram of still another display panel according to some embodiments of the present disclosure.

FIG. 9 is a schematic block diagram of still another display panel according to some embodiments of the present disclosure. Referring to FIG. 9, the display panel 20 may further comprise a detection signal acquisition circuit 30. The detection signal acquisition circuit 30 is configured to collect an electrical signal generated by the phototransistor 200 according to the infrared light. For example, the detection signal acquisition circuit 30 is connected to the detection signal line (the detection signal terminal Sense), so as to collect the electrical signal generated by the phototransistor 200. It should be noted that, in respective embodiments of the present disclosure, the working principle and the circuit structure of the detection signal acquisition circuit 30 are not limited, and the detection signal acquisition circuit 30 may adopt any analog circuits, digital circuits, chips, etc., as long as the corresponding functions can be implemented. For example, a plurality of detection signal acquisition circuits 30 that are in one-to-one correspondence with a plurality of detection pixels can be integrated into one chip through a plurality of detection signal lines, thereby simplifying the structure of the display panel.

Figure 10:
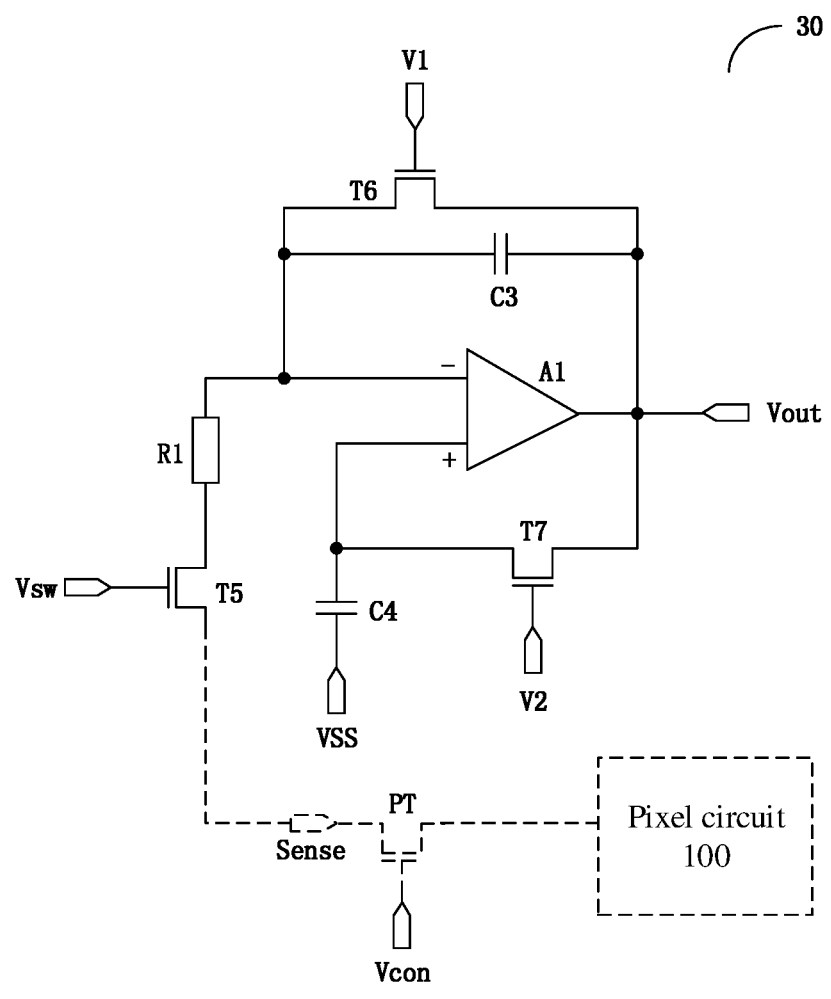
FIG. 10 is a schematic diagram of a detection signal acquisition circuit of a display panel according to some embodiments of the present disclosure.

FIG. 10 is a schematic diagram of a detection signal acquisition circuit of a display panel according to some embodiments of the present disclosure. Referring to FIG. 10, this circuit is an example of the detection signal acquisition circuit 30 described in FIG. 9, but the embodiments of the present disclosure are not limited thereto. The detection signal acquisition circuit 30 comprises an integrating circuit, the integrating circuit comprises an operational amplifier A1, an integrating capacitor C3, a storage capacitor C4 and a resistor R1, and the detection signal acquisition circuit 30 further comprises a fifth transistor T5, a sixth transistor T6 and a seventh transistor T7. The detection signal acquisition circuit 30 is configured to adopt the above-mentioned integrating circuit to collect, in a case where a sampling switch signal (provided by a sampling switch terminal Vsw) is turned on, a current signal generated by the phototransistor PT according to the infrared light, and to output a voltage signal corresponding to the current signal.

As illustrated in FIG. 10, a gate electrode of the fifth transistor T5 is connected to the sampling switch terminal Vsw to receive the sampling switch signal, a first electrode of the fifth transistor T5 is connected to the detection signal terminal Sense to receive the electrical signal (such as, the current signal) generated by the phototransistor PT, and a second electrode of the fifth transistor T5 is connected to a first electrode of the resistor R1. A second electrode of the resistor R1 is connected to a first input terminal (a negative input terminal) of the operational amplifier A1. A first electrode of the integrating capacitor C3 is connected to the first input terminal of the operational amplifier A1, and a second electrode of the integrating capacitor C3 is connected to an output terminal Vout of the operational amplifier A1. A gate electrode of the sixth transistor T6 is connected to a variable acquisition terminal V1 to receive a variable acquisition signal, a first electrode of the sixth transistor T6 is connected to the first input terminal of the operational amplifier A1, and a second electrode of the sixth transistor T6 is connected to the output terminal Vout of the operational amplifier A1. A first electrode of the storage capacitor C4 is connected to a second input terminal (a positive input terminal) of the operational amplifier A1, and a second electrode of the storage capacitor C4 is connected to the second voltage terminal VSS. A gate electrode of the seventh transistor T7 is connected to a reset switch terminal V2 to receive a reset switch signal, a first electrode of the seventh transistor T7 is connected to the second input terminal of the operational amplifier A1, and a second electrode of the seventh transistor T7 is connected to the output terminal Vout of the operational amplifier A1. The working principle of the detection signal acquisition circuit 30 is described below.

In a case where there is no finger at the detection position, the sampling control signal (provided by the sampling control terminal Vcon) and the sampling switch signal (provided by the sampling switch terminal Vsw) are both turned on (that is, both are at valid levels), the phototransistor PT detects the infrared light and generates a current, and the fifth transistor T5 is turned on. A voltage $V_0$ is generated at the first input terminal of the operational amplifier A1. In this case, the variable acquisition signal (provided by the variable acquisition terminal V1) and the reset switch signal (provided by the reset switch terminal V2) are both turned on, the sixth transistor T6 and the seventh transistor T7 are both turned on, and a voltage of the second input terminal of the operational amplifier A1 is also $V_0$. Then, the variable acquisition signal and the reset switch signal are turned off, so as to turn off the sixth transistor T6 and the seventh transistor T7. The circuit integrates the current signal generated by the phototransistor PT, and in this case, a voltage of the output terminal Vout of the operational amplifier A1 can be expressed as:

$$V_{out1} = \frac{1}{C}\int_0^t I(t)dt.$$

In the above formula, $V_{out1}$ represents the voltage of the output terminal Vout of the operational amplifier A1, C represents a capacitance value of the integrating capacitor C3, t represents detection time, and I(t) represents a current value generated by the phototransistor PT.

In a case where the finger is at the detection position, the finger can reflect the infrared light, so that the luminous intensity of the infrared light that is incident on the phototransistor PT changes, and therefore, the current generated by the phototransistor PT may also change accordingly. The sampling control signal and the sampling switch signal are both turned on, the phototransistor PT detects the infrared light and generates a current, and the fifth transistor T5 is turned on. The variable acquisition signal and the reset switch signal remain to be turned off, so that the sixth transistor T6 and the seventh transistor T7 remain to be turned off. In this case, the voltage of the output terminal Vout of the operational amplifier A1 becomes:

$$V_{out2} = V_{out1} - \frac{1}{C}\int_0^t [I(t) + I'(t)]dt.$$

In the above formula, $V_{out2}$ represents the voltage of the output terminal Vout of the operational amplifier A1 in this phase, and I'(t) represents a current change amount of the phototransistor PT, that is, the current generated by the phototransistor PT in this phase is I(t)+I'(t).

It can be obtained according to calculation:

$\int_0^t I(t)dt = (-V_{out2})C.$

Therefore, an intensity change amount of the infrared light detected by the phototransistor PT is:

$\Delta I = =q\int_0^t I(t)dt = q(-V_{out2})C.$

In the above formula, ΔI represents the intensity change amount of the infrared light, and q is a constant value. The fingerprint detection or the touch detection can be implemented according to the intensity change amount of the infrared light.

For example, in an example, the display panel 20 is configured to perform the fingerprint recognition after the screen is woken up. When the screen is woken up, the infrared light-emitting element 110 starts to emit infrared light, and the phototransistor PT can induce a background current I(t). In a case where the finger is placed on the screen, the phototransistor PT senses the infrared light reflected by the finger. In a region where no finger (or fingerprint) covers, there is no significant reflected light, and the current change amount induced by the phototransistor PT in this region is zero. In a region covered by the finger (or fingerprint), there is obvious reflected light, and the phototransistor PT in this region can induce the current change amount I'(t), thereby implementing the fingerprint recognition.

For example, in another example, the display panel 20 is configured to perform the fingerprint recognition and implement a screen wake-up function before the screen is woken up. Before the screen is woken up, that is, the screen is in an off state, the display pixels in the display panel 20 do not display, while the detection pixels remain to work. For example, a frequency of the scanning signal provided to the detection pixel can be reduced, that is, similar to always on display (AOD) technology (or called a screen-off display technology), so as to implement a normally-on function of the infrared light-emitting element 110 in the detection pixel, and reduce the power consumption. The phototransistor PT induces a background current I(t). When the finger is placed on the screen, in the region covered by the finger (or fingerprint), the phototransistor PT in the region can induce the current change amount I'(t), thereby implementing the fingerprint recognition function and the screen wake-up function.

It should be noted that, in respective embodiments of the present disclosure, the working mode of the display panel 20 is not limited to the manner described above, and the working mode of the display panel 20 can be flexibly set according to actual needs, so that the fingerprint recognition function of the display panel 20 matches other functions.

At least one embodiment of the present disclosure further provides an array substrate, which comprises a base substrate and the photoelectric detection circuit according to any one of the embodiments of the present disclosure. The phototransistor in the photoelectric detection circuit is on the base substrate, and the infrared light-emitting element is on a side of the phototransistor away from the base substrate. The infrared light-emitting element in the array substrate can improve the light transmittance while improving the light extraction efficiency, and can effectively shield the stray light incident from the lateral side, and in a case where the above-mentioned photoelectric detection circuit is used to detect the infrared light emitted by the pixel circuit, the photosensitive responsivity can be improved, thereby improving the signal accuracy.

Figure 11:
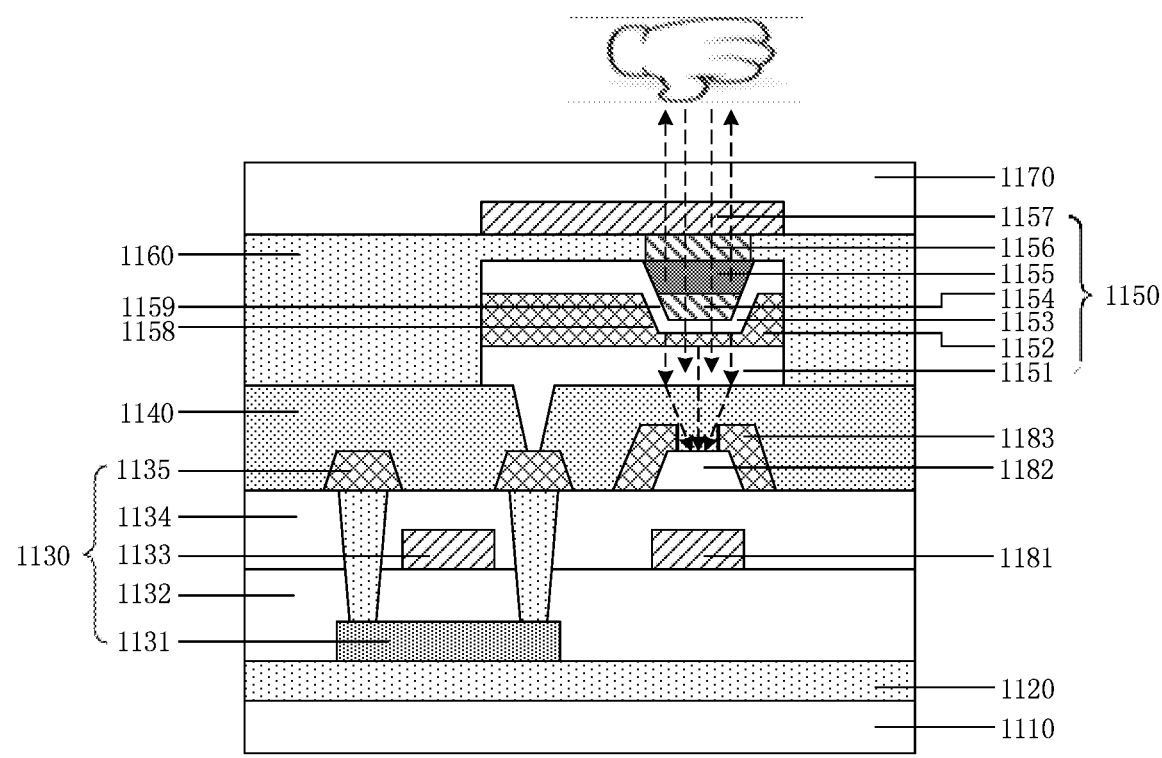
FIG. 11 is a schematic diagram of a layer structure of an array substrate according to some embodiments of the present disclosure.

FIG. 11 is a schematic diagram of a layer structure of an array substrate according to some embodiments of the present disclosure, and the array substrate comprises the photoelectric detection circuit 10 according to any one of the embodiments of the present disclosure. Referring to FIG. 11, the array substrate sequentially comprises a base substrate 1110, a buffer layer 1120, a pixel circuit layer 1130, a flat layer 1140, an infrared OLED layer 1150, and a pixel defining layer 1160. The pixel circuit layer 1130 comprises an active layer 1131, a first insulating layer 1132, a gate-electrode layer 1133, a second insulating layer 1134, and a source-drain layer 1135. In this embodiment, the thin film transistor in the pixel circuit layer 1130 is a top-gate type, the embodiments of the present disclosure are not limited thereto, and the thin film transistor may also be a bottom-gate type, which may be determined according to actual needs. For example, the infrared OLED layer 1150 is the infrared light-emitting element L1 in the photoelectric detection circuit 10. For example, in an example, the array substrate further comprises a protective layer 1170, and the protective layer 1170 is on the pixel defining layer 1160 and covers the infrared OLED layer 1150, so as to constitute a display panel.

The infrared OLED layer 1150 is the aforementioned infrared light-emitting element, and sequentially comprises a first electrode layer 1152, a first transparent electrode layer 1153, an electroluminescent layer 1154-1156 and a second electrode layer 1157 along a direction away from the base substrate 1110. For example, the infrared OLED layer 1150 further comprises a second transparent electrode layer 1151. The first transparent electrode layer 1153, the first electrode layer 1152, and the second transparent electrode layer 1151 constitute an anode having a laminated structure, and cooperate with the second electrode layer 1157, and in this case, the second electrode layer 1157 functions as a cathode, thereby driving the electroluminescent layer 1154-1156 to emit infrared light. For example, in other examples, the second transparent electrode layer 1151 may also be omitted, and only the first transparent electrode layer 1153 and the first electrode layer 1152 constitute the anode, and the embodiments of the present disclosure are not limited thereto. In this embodiment, the second transparent electrode layer 1151 is on the flat layer 1140. The first electrode layer 1152 is on the second transparent electrode layer 1151 and comprises a first sunk region 1158 formed by a portion having a reduced thickness. For example, the first sunk region 1158 is sunken toward a direction close to a gate electrode 1181, a photosensitive layer 1182 and an electrode layer 1183 of the phototransistor PT. For example, the first electrode layer 1152 is a metal electrode layer (for example, a silver electrode layer). The first transparent electrode layer 1153 is on a surface of a side of the first electrode layer 1152 away from the base substrate 1110. For example, the first transparent electrode layer 1153 is provided with a second sunk region 1159 in the first sunk region 1158, and the second sunk region 1159 is located in the first sunk region 1158. For example, the second sunk region 1159 and the first sunk region 1158 substantially overlap. The electroluminescent layer 1154-1156 comprises a hole transport layer 1154, a light-emitting layer 1155, and an electron transport layer 1156, which are stacked. The electroluminescent layer 1154-1156 is on a side of the first transparent electrode layer 1153 away from the base substrate 1110 and is located at least in the first sunk region 1158. The second electrode layer 1157 is on a surface of a side of the electroluminescent layer 1154-1156 away from the base substrate 1110. For example, the electroluminescent layer 1154-1156 may comprise organic electroluminescent materials, and may also comprise quantum dot luminescent materials or other suitable materials, which are not limited in the embodiments of the present disclosure.

For example, because the first sunk region 1158 is provided, the first electrode layer 1152 and the first transparent electrode layer 1153 constitute an approximate cup-like laminated structure (a reflective cup structure), so that the light extraction efficiency can be improved. Around the first sunk region 1158, the anode formed by the first electrode layer 1152 and the first transparent electrode layer 1153 has a large thickness in a direction parallel to the base substrate 1110, and thus can shield the stray light incident from the lateral side of the reflective cup structure, and in a case where the above-mentioned photoelectric detection circuit is used to detect the infrared light emitted by the pixel circuit, the signal accuracy can be improved. A thickness of the first electrode layer 1152 in the first sunk region 1158 is smaller than a thickness of the first electrode layer 1152 in other regions except the first sunk region 1158, and therefore, the light transmittance of the first electrode layer 1152 in the first sunk region 1158 can be increased.

The gate electrode 1181 of the phototransistor PT in the photoelectric detection circuit 10 and the gate-electrode layer 1133 are in a same layer (that is, fabricated in a same layer), and the electrode layer 1183 of the phototransistor PT and the source-drain layer 1135 are in a same layer (that is, fabricated in a same layer). The photosensitive layer 1182 of the phototransistor PT is on the second insulating layer 1134, and the electrode layer 1183 is in an edge region of the photosensitive layer 1182 and is covered by the flat layer 1140. For example, the electrode layer 1183 is used to form a source electrode and a drain electrode of the phototransistor PT. For example, the phototransistor PT and the infrared light-emitting element (namely, the infrared OLED layer 1150) at least partially overlap in a direction perpendicular to the base substrate 1110, or may completely overlap, so as to facilitate to irradiate the infrared light on the phototransistor PT. Due to the structural characteristics of the phototransistor PT itself, the photosensitive layer 1182 is not shielded by the electrode layer 1183, and the infrared light (illustrated by dotted lines in FIG. 11) emitted by the infrared OLED is reflected by the finger, and can directly incident on the photosensitive layer 1182, so that the photosensitive responsivity is high. A thickness of the first electrode layer 1152 in the first sunk region 1158 is small, which can improve the light transmittance, and facilitate to enable the infrared light reflected by the finger to incident on the photosensitive layer 1182, thereby further improving the photosensitive responsivity. For example, the photosensitive layer 1182 is formed of a single semiconductor material, such as gallium arsenide (GaAs), indium phosphide (InP), etc., these semiconductor materials are sensitive to infrared light and do not require a doping process, and the process difficulty is low. Certainly, the embodiments of the present disclosure are not limited thereto, and the photosensitive layer 1182 may also be formed of a semiconductor material having a wider spectral range, such as germanium silicide (GeSi), and the like, so long as to work together with an optical filter. For example, the photosensitive layer 1182 can be manufactured by a magnetron sputtering process.

The specific features of other parts of the array substrate are similar to those of a conventional array substrate and are not described in detail herein. It should be noted that, in respective embodiments of the present disclosure, the array substrate can comprise more or less structures or components, and the relative positional relationship among the various structures or components may be determined according to actual needs, and the embodiments of the present disclosure are not limited thereto.

At least one embodiment of the present disclosure further provides an infrared light-emitting element, and the infrared light-emitting element comprises a first transparent electrode layer, a first electrode layer, an electroluminescent layer, and a second electrode layer. The infrared light-emitting element is disposed, for example, on a base substrate. The first electrode layer comprises a first sunk region formed by a portion having a reduced thickness; the first transparent electrode layer is on a surface of a side of the first electrode layer away from the base substrate; the electroluminescent layer is on a side of the first transparent electrode layer away from the base substrate and is located at least in the first sunk region; and the second electrode layer is on a surface of a side of the electroluminescent layer away from the base substrate. The first electrode layer and the first transparent electrode layer of the infrared light-emitting element constitute an approximate cup-like laminated structure (a reflective cup structure), and a thickness of the first electrode layer in the first sunk region is smaller than a thickness of the first electrode layer in other regions except the first sunk region. Therefore, the light transmittance of the first electrode layer in the first sunk region can be improved while the light extraction efficiency is improved, and the stray light incident from the lateral side can be effectively shielded, thereby improving the signal accuracy. The technical effect of the infrared light-emitting element can be referred to the related description about the infrared OLED layer 1150, and details are not described herein again.

At least one embodiment of the present disclosure further provides a photoelectric detection method using the photoelectric detection circuit according to any one of the embodiments of the present disclosure. By using the photoelectric detection circuit and the corresponding photoelectric detection method, the process difficulty can be reduced, the circuit structure can be simplified, and the photosensitive responsivity can be improved, so as to be beneficial to achieve the full-screen fingerprint recognition and the touch function. The photoelectric detection method can be further used for touch control, fingerprint image acquisition, fingerprint recognition, and the like.

For example, in an example, the photoelectric detection method comprises following operations:

providing the scanning signal and the light-emitting data signal to the pixel circuit 100 to enable the infrared light-emitting element 110 to emit the infrared light; and acquiring the electrical signal generated by the phototransistor 200 in response to the sampling control signal and according to the infrared light emitted by the infrared light-emitting element 110.

It should be noted that, in respective embodiments of the present disclosure, the photoelectric detection method may further comprise more steps, and the order relationship among the various steps is not limited. For a detailed description and the technical effects of the photoelectric detection method, reference may be made to the description of the working principle of the photoelectric detection circuit 10 in the embodiments of the present disclosure, and details are not described herein again.

At least one embodiment of the present disclosure further provides a fingerprint image acquisition method using the display panel according to any one of the embodiments of the present disclosure. By using the fingerprint image acquisition method, the process difficulty can be reduced, the circuit structure can be simplified, and the photosensitive responsivity can be improved, so as to be beneficial to achieve the full-screen fingerprint recognition and the touch function.

For example, in an example, the fingerprint image acquisition method comprises following operations:

providing the scanning signal and the light-emitting data signal to the pixel circuit 100 to enable the infrared light-emitting element 110 to emit the infrared light;

acquiring the electrical signal generated by the phototransistor 200 in response to the sampling control signal and according to the infrared light emitted by the infrared light-emitting element 110 and reflected by a fingerprint of a user; and obtaining an image of the fingerprint based on the electrical signal.

For example, in another example, in a case where the display panel is configured to perform fingerprint image acquisition and implement a screen wake-up function before the screen is woken up, the fingerprint image acquisition method further comprises:

in a case where the display pixels of the display panel do not display, reducing a frequency of the scanning signal supplied to the pixel circuit 100. This method is similar to the AOD technology, so as to implement a normally-on function of the infrared light-emitting element 110 in the detection pixel, and reduce the power consumption.

It should be noted that, in respective embodiments of the present disclosure, the fingerprint image acquisition method may also comprise more steps, and the order relationship among the various steps is not limited. For example, after the fingerprint image of the user is obtained by using the fingerprint image acquisition method, the fingerprint recognition can be implemented through processing and calculation, and the above processing and calculation can be implemented by any applicable hardware or software such as a processor, an arithmetic circuit, or the like. For a detailed description and the technical effects of the fingerprint image acquisition method, reference may be made to the descriptions of the working principles of the photoelectric detection circuit 10 and the display panel 20 in the embodiments of the present disclosure, and details are not described herein again.

The following statements should be noted.

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A photoelectric detection circuit, comprising:
a pixel circuit, comprising an infrared light-emitting element and configured to emit infrared light according to a scanning signal and a light-emitting data signal; and
a phototransistor, configured to detect the infrared light emitted by the pixel circuit and reflected by a detection object in response to a sampling control signal,
wherein a gate electrode of the phototransistor is configured to be connected to a sampling control line to receive the sampling control signal,
a first electrode of the phototransistor is configured to be connected to a first voltage terminal to receive a first voltage, and
a second electrode of the phototransistor is configured to be connected to a detection signal line to apply an electrical signal generated by the phototransistor according to the infrared light to the detection signal line.

2. The photoelectric detection circuit according to claim 1, wherein the pixel circuit further comprises a drive circuit, a data writing circuit, and a compensation circuit;
the drive circuit comprises a control terminal, a first terminal and a second terminal, and is configured to control a driving current for driving the infrared light-emitting element to emit light, and the first terminal of the drive circuit receives a first voltage of a first voltage terminal;
the data writing circuit is connected to the control terminal of the drive circuit, and is configured to write the light-emitting data signal to the control terminal of the drive circuit in response to the scanning signal;
the compensation circuit is connected to the control terminal of the drive circuit, the second terminal of the drive circuit, and a second voltage terminal to receive a second voltage, and is configured to store the light-emitting data signal written by the data writing circuit, compensate the drive circuit, and adjust a voltage of the second terminal of the drive circuit in a coupling way; and
a first terminal of the infrared light-emitting element is connected to the second terminal of the drive circuit, a second terminal of the infrared light-emitting element receives the second voltage of the second voltage terminal, and the infrared light-emitting element is configured to emit the infrared light according to the driving current.

3. The photoelectric detection circuit according to claim 2, wherein the pixel circuit further comprises a light-emitting control circuit and a reset circuit;
the light-emitting control circuit is connected to the first terminal of the drive circuit, and is configured to apply the first voltage of the first voltage terminal to the first terminal of the drive circuit in response to a light-emitting control signal; and
the reset circuit is connected to the second terminal of the drive circuit, and is configured to apply a reset voltage to the second terminal of the drive circuit in response to a reset signal.

4. The photoelectric detection circuit according to claim 3,
wherein the light-emitting control circuit comprises a third transistor, a gate electrode of the third transistor is configured to be connected to a light-emitting control line to receive the light-emitting control signal, a first electrode of the third transistor is configured to be connected to the first voltage terminal to receive the first voltage, and a second electrode of the third transistor is configured to be connected to the first terminal of the drive circuit; and
the reset circuit comprises a fourth transistor, a gate electrode of the fourth transistor is configured to be connected to a reset line to receive the reset signal, a first electrode of the fourth transistor is configured to be connected to the second terminal of the drive circuit, and a second electrode of the fourth transistor is configured to be connected to the second voltage terminal to receive the reset voltage.

5. The photoelectric detection circuit according to claim 2,
wherein the drive circuit comprises a first transistor, a gate electrode of the first transistor serves as the control terminal of the drive circuit, a first electrode of the first transistor serves as the first terminal of the drive circuit, and a second electrode of the first transistor serves as the second terminal of the drive circuit;
the data writing circuit comprises a second transistor, a gate electrode of the second transistor is configured to be connected to a scanning line to receive the scanning signal, a first electrode of the second transistor is configured to be connected to a data line to receive the light-emitting data signal, and a second electrode of the second transistor is configured to be connected to the gate electrode of the first transistor; and
the compensation circuit comprises a first capacitor and a second capacitor, a first electrode of the first capacitor is configured to be connected to the gate electrode of the first transistor, a second electrode of the first capacitor is configured to be connected to the second electrode of the first transistor, a first electrode of the second capacitor is configured to be connected to the second electrode of the first transistor, and a second electrode of the second capacitor is configured to be connected to the second voltage terminal to receive the second voltage.

6. An array substrate, comprising a base substrate and the photoelectric detection circuit according to claim 1,
wherein the phototransistor is on the base substrate; and the infrared light-emitting element is on a side of the phototransistor away from the base substrate.

7. The array substrate according to claim 6, wherein, along a direction away from the base substrate, the infrared light-emitting element sequentially comprises:
a first electrode layer comprising a first sunk region formed by a portion having a reduced thickness;
a first transparent electrode layer on a surface of a side of the first electrode layer away from the base substrate;
an electroluminescent layer on a side of the first transparent electrode layer away from the base substrate and located at least in the first sunk region; and
a second electrode layer on a surface of a side of the electroluminescent layer away from the base substrate.

8. The array substrate according to claim 7, wherein the first transparent electrode layer is provided with a second sunk region in the first sunk region, and the second sunk region is located in the first sunk region.

9. The array substrate according to claim 6, wherein the phototransistor and the infrared light-emitting element at least partially overlap in a direction perpendicular to the base substrate.

10. The array substrate according to claim 6, wherein the infrared light-emitting element further comprises a second transparent electrode layer, and the second transparent electrode layer is on a surface of a side of the first electrode layer close to the base substrate.

11. The array substrate according to claim 6, further comprising a pixel circuit layer, wherein the pixel circuit layer comprises a gate-electrode layer, and
a gate electrode of the phototransistor and the gate-electrode layer are in a same layer.

12. The array substrate according to claim 11, wherein the pixel circuit layer further comprises a source-drain layer, the phototransistor further comprises an electrode layer, and the source-drain layer and the electrode layer are in a same layer.

13. A display panel, comprising the array substrate according to claim 6.

14. The display panel according to claim 13, further comprising a plurality of pixel unit groups,
wherein each of the plurality of pixel unit groups comprises a plurality of display pixels and at least one detection pixel, and the at least one detection pixel comprises the photoelectric detection circuit.

15. The display panel according to claim 14, further comprising a gate drive circuit and a data drive circuit,
wherein the gate drive circuit is configured to provide the scanning signal to the plurality of display pixels and the at least one detection pixel of each of the plurality of pixel unit groups; and
the data drive circuit is configured to provide a display data signal and the light-emitting data signal, to enable the plurality of display pixels to display and enable the infrared light-emitting element in the at least one detection pixel to emit the infrared light.

16. The display panel according to claim 13, further comprising a detection signal acquisition circuit,
wherein the detection signal acquisition circuit is configured to collect an electrical signal generated by the phototransistor according to the infrared light.

17. The display panel according to claim 16, wherein the detection signal acquisition circuit comprises an integrating circuit, and is configured to adopt the integrating circuit to collect, in a case where a sampling switch signal is turned on, a current signal generated by the phototransistor according to the infrared light, and to output a voltage signal corresponding to the current signal.

18. A photoelectric detection method using a photoelectric detection circuit, wherein the photoelectric detection circuit comprises:
a pixel circuit, comprising an infrared light-emitting element and configured to emit infrared light according to a scanning signal and a light-emitting data signal; and
a phototransistor, configured to detect the infrared light emitted by the pixel circuit and reflected by a detection object in response to a sampling control signal,
wherein a gate electrode of the phototransistor is configured to be connected to a sampling control line to receive the sampling control signal,
a first electrode of the phototransistor is configured to be connected to a first voltage terminal to receive a first voltage, and
a second electrode of the phototransistor is configured to be connected to a detection signal line to apply an electrical signal generated by the phototransistor according to the infrared light to the detection signal line;
the photoelectric detection method comprises:
providing the scanning signal and the light-emitting data signal to the pixel circuit to enable the infrared light-emitting element to emit the infrared light; and
acquiring an electrical signal generated by the phototransistor in response to the sampling control signal and according to the infrared light emitted by the infrared light-emitting element.

19. A fingerprint image acquisition method using a display panel, wherein the display panel comprises an array substrate, the array substrate comprises a base substrate and a photoelectric detection circuit, and
the photoelectric detection circuit comprises:

a pixel circuit, comprising an infrared light-emitting element and configured to emit infrared light according to a scanning signal and a light-emitting data signal; and a phototransistor, configured to detect the infrared light emitted by the pixel circuit and reflected by a detection object in response to a sampling control signal, wherein a gate electrode of the phototransistor is configured to be connected to a sampling control line to receive the sampling control signal, a first electrode of the phototransistor is configured to be connected to a first voltage terminal to receive a first voltage, and a second electrode of the phototransistor is configured to be connected to a detection signal line to apply an electrical signal generated by the phototransistor according to the infrared light to the detection signal line, wherein the phototransistor is on the base substrate; and the infrared light-emitting element is on a side of the phototransistor away from the base substrate; and the fingerprint image acquisition method comprises:

providing the scanning signal and the light-emitting data signal to the pixel circuit to enable the infrared light-emitting element to emit the infrared light;

acquiring an electrical signal generated by the phototransistor in response to the sampling control signal and according to the infrared light emitted by the infrared light-emitting element and reflected by a fingerprint of a user; and obtaining an image of the fingerprint based on the electrical signal.

* * * * *